(12) United States Patent
Chuang et al.

(10) Patent No.: US 12,362,270 B2
(45) Date of Patent: Jul. 15, 2025

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Kris Lipu Chuang, Hsinchu (TW); Tzu-Sung Huang, Tainan (TW); Chih-Wei Lin, Hsinchu County (TW); Yu-fu Chen, Hsinchu (TW); Hsin-Yu Pan, Taipei (TW); Hao-Yi Tsai, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 643 days.

(21) Appl. No.: 17/679,052

(22) Filed: Feb. 23, 2022

(65) Prior Publication Data

US 2023/0268260 A1 Aug. 24, 2023

(51) Int. Cl.
| | |
|---|---|
| *H01L 23/22* | (2006.01) |
| *H01L 21/48* | (2006.01) |
| *H01L 23/00* | (2006.01) |
| *H01L 23/498* | (2006.01) |
| *H01L 25/00* | (2006.01) |
| *H01L 25/10* | (2006.01) |
| H01L 25/065 | (2023.01) |

(52) U.S. Cl.
CPC .... *H01L 23/49822* (2013.01); *H01L 21/4857* (2013.01); *H01L 21/486* (2013.01); *H01L 23/49838* (2013.01); *H01L 24/19* (2013.01); *H01L 24/20* (2013.01); *H01L 24/32* (2013.01); *H01L 25/105* (2013.01); *H01L 25/50* (2013.01); *H01L 24/48* (2013.01); *H01L 25/0657* (2013.01); *H01L 2224/211* (2013.01); *H01L 2224/32225* (2013.01); *H01L 2224/48227* (2013.01); *H01L 2225/0651* (2013.01); *H01L 2225/107* (2013.01)

(58) Field of Classification Search
CPC .................................................. H01L 23/49822
USPC .................................................. 257/773, 786
See application file for complete search history.

(56) References Cited

U.S. PATENT DOCUMENTS

| | | | |
|---|---|---|---|
| 8,405,207 B1 * | 3/2013 | Crisp | H01L 25/0753 257/E23.07 |
| 8,513,813 B2 * | 8/2013 | Crisp | H01L 24/49 257/784 |

(Continued)

*Primary Examiner* — Trang Q Tran
(74) *Attorney, Agent, or Firm* — JCIPRNET

(57) ABSTRACT

A package structure includes a first redistribution layer, a semiconductor die, and through vias. The first redistribution layer includes dielectric layers, first conductive patterns, and second conductive patterns. The dielectric layers are located in a core region and a peripheral region of the first redistribution layer. The first conductive patterns are embedded in the dielectric layers in the core region, wherein the first conductive patterns are arranged in the core region with a pattern density that gradually increases or decreases from a center of the core region to a boundary of the core region. The second conductive patterns are embedded in the dielectric layers in the peripheral region. The semiconductor die is disposed on the core region over the first conductive patterns. The through vias are disposed on the peripheral region and electrically connected to the second conductive patterns.

14 Claims, 15 Drawing Sheets

(56) References Cited

U.S. PATENT DOCUMENTS

| | | | |
|---|---|---|---|
| 8,890,319 B2* | 11/2014 | Sapone | H01L 21/561 |
| | | | 257/781 |
| 9,000,584 B2 | 4/2015 | Lin et al. | |
| 9,048,222 B2* | 6/2015 | Hung | H01L 23/5384 |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2011/0233771 A1* | 9/2011 | Kwon | H01L 23/49816 |
| | | | 257/737 |
| 2019/0378795 A1* | 12/2019 | Lee | H01L 25/50 |

\* cited by examiner

PACKAGE STRUCTURE AND METHOD OF FABRICATING THE SAME

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. In addition, such packages may further be integrated to a semiconductor substrate or carrier after dicing. Therefore, the reliability of the electrical connection between conductive terminals and an internal component (e.g. a redistribution circuit structure) within each package becomes important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
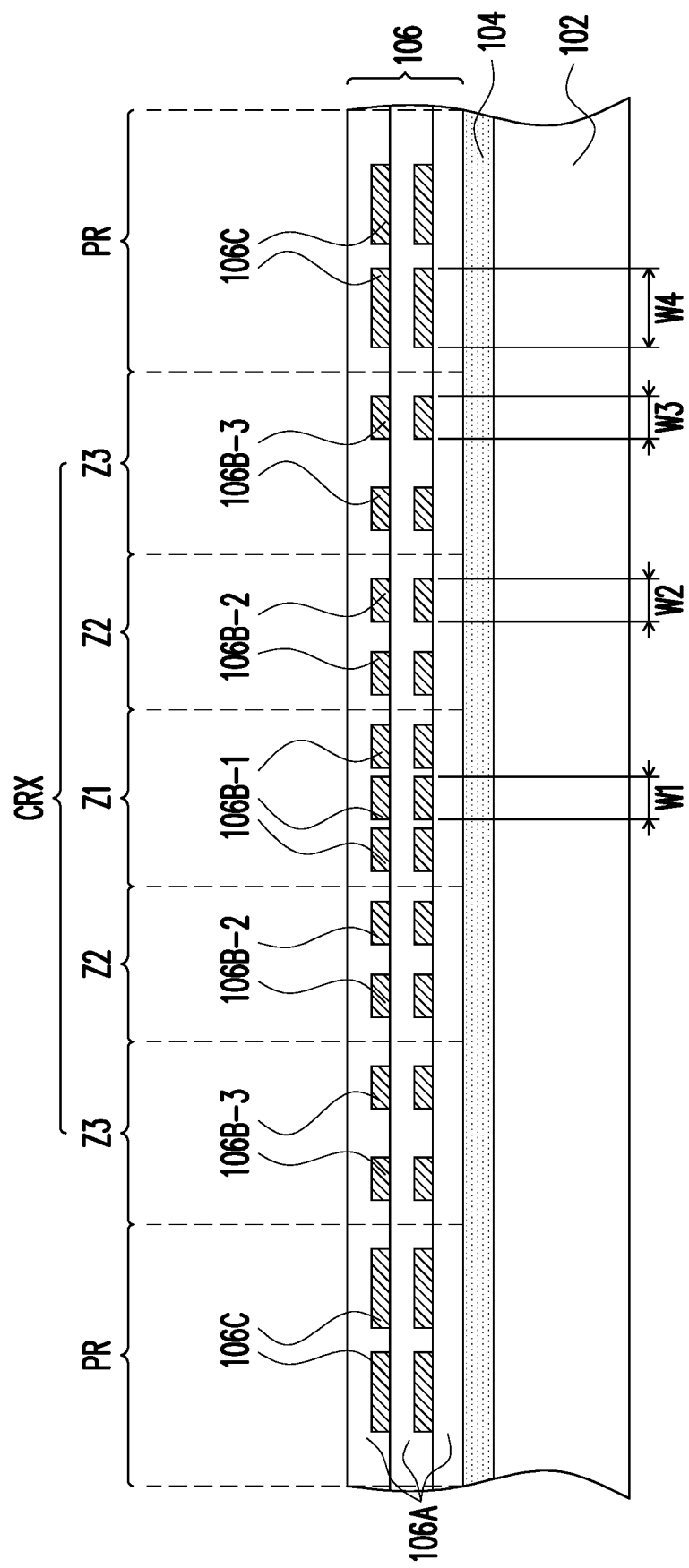
FIG. 1A to FIG. 7 are schematic top and sectional views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 7 are schematic top and sectional views of various stages in a method of fabricating a package structure according to some exemplary embodiments of the present disclosure. Referring to FIG. 1A, a carrier 102 is provided. In some embodiments, the carrier 102 may be a glass carrier or any suitable carrier for carrying a semiconductor wafer or a reconstituted wafer for the manufacturing method of the package structure. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 304 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

In an alternative embodiment, a buffer layer (not shown) may be coated on the debond layer 104, where the debond layer 104 is sandwiched between the buffer layer and the carrier 102, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Figure 1B:
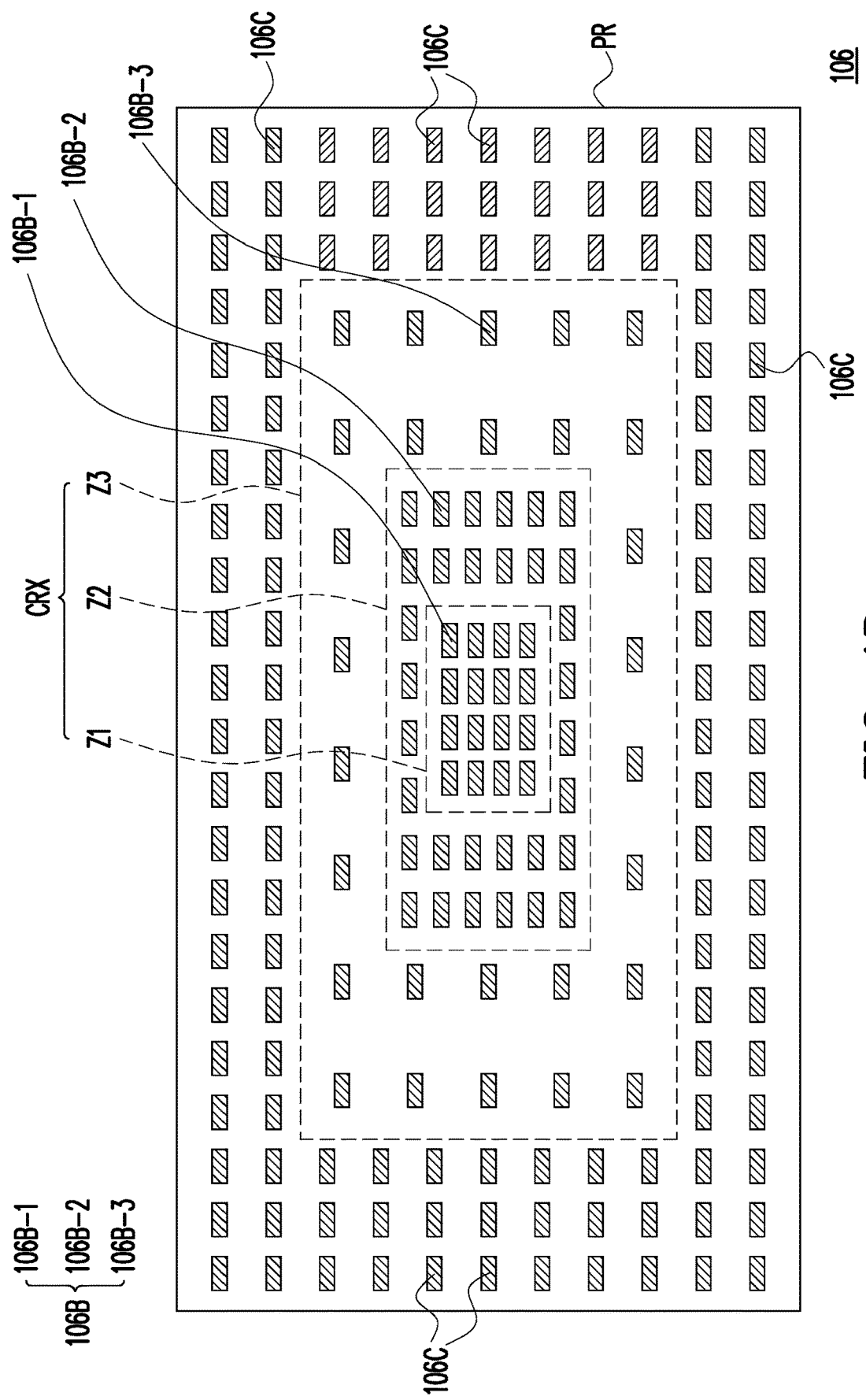

As further illustrated in FIG. 1A, a first redistribution layer 106 (or backside redistribution layer) is formed over the carrier 102. For example, the first redistribution layer 106 is formed on the debond layer 104, and the formation of the first redistribution layer 106 includes sequentially forming one or more dielectric layers 106A, one or more layers of first conductive patterns 106B, and one or more layers of second conductive patterns 106C in alternation. Referring to FIG. 1A and a top view of FIG. 1A as shown in FIG. 1B, the first redistribution layer 106 is formed with a core region CRX and a peripheral region PR surrounding the core region CRX. In some embodiments, the core region CRX is a region where semiconductor dies may be bonded thereto in subsequent steps, and this region may also be referred as a die bonding region.

In the exemplary embodiment, the first conductive patterns 106B are located in the core region CRX, while the second conductive patterns 106C are located in the peripheral region PR. The first conductive patterns 106B are embedded in the dielectric layers 106A in the core region CRX, and are arranged in the core region CRX with a pattern density that gradually decreases from a center of the core region CRX to a boundary of the core region CRX. In other words, the first conductive patterns 106B have a more dense pattern at the center of the core region CRX, while the first conducive patterns 106B have less dense pattern at the boundary of the core region CRX. Furthermore, the second conductive patterns 106C are embedded in the dielectric layers 106A in the peripheral region PR, whereby the second conductive patterns 106C have uniform pattern density in the peripheral region PR. In other words, the second conductive patterns 106C may be evenly distributed across the peripheral region PR.

In some embodiments, the core region CRX of the first redistribution layer 106 includes a first zone Z1, a second zone Z2 encircling the first zone Z1, and a third zone Z3 encircling the first zone Z1 and the second zone Z2. For example, the first zone Z1 has a square shape (or rectangular shape) from the top view, the second zone Z2 has a square shape (or rectangular shape) from the top view and is surrounding the first zone Z1, while the third zone Z3 has a square shape (or rectangular shape) from the top view and is surrounding the first zone Z1 and the second zone Z2.

As illustrated in FIG. 1B, in some embodiments, the first conductive patterns 106B includes a plurality of first sub conductive patterns 106B-1, a plurality of second sub conductive patterns 106B-2 and a plurality of third sub conductive patterns 106B-3. The first sub conductive patterns 106B-1 are disposed in the first zone Z1 of the core region CRX (die bonding region) and is arranged with a first pattern density D1. The second sub conductive patterns 106B-2 are disposed in the second zone Z2 of the core region CRX (die bonding region) and is arranged with a second pattern density D2. The third sub conductive patterns 106B-3 are disposed in the third zone Z3 of the core region CRX (die bonding region) and is arranged with a third pattern density D3, whereby $D1 \neq D2 \neq D3$. In the exemplary embodiment, the first pattern density D1 is the highest pattern density of the first conductive patterns 106B in the core region CRX, while the third pattern density D3 is the lowest pattern density of the first conductive patterns 106B in the core region CRX. For example, the first pattern density D1 is 70% of the first zone Z1, the second pattern density D2 is 60% of the second zone Z2 and the third pattern density D3 is 50% of the third zone Z3. In the exemplary embodiment, the pattern density (D1~D3) represent a volume percent of the first conductive patterns 106B in their respective zones (Z1~Z3). In other words, a first pattern density D1 of 70% in the first zone Z1 tends to mean that the first conductive patterns 106B (or first sub conductive patterns 106B-1) occupies 70% volume in the first zone Z1 of the core region CRX.

As further illustrated in FIG. 1A and FIG. 1B, in some embodiments, the first conductive patterns 106B arranged with different pattern densities (D1~D3) are formed by adjusting a spacing of the first conductive patterns 106B in the different zones (Z1~Z3) of the core region CRX. For example, the first sub conductive patterns 106B-1 having a width W1 is arranged with a first spacing in the first zone Z1, the second sub conductive patterns 106B-2 having a width W2 is arranged with a second spacing in the second zone Z2, and the third sub conductive patterns 106B-3 having a third width W3 is arranged with a third spacing in the third zone Z3, wherein W1=W2=W3, and the second spacing is greater than the first spacing, while the third spacing is greater than the first spacing and the second spacing. In other words, the first conductive patterns 106B (106B-1, 106B-2 and 106B-3) have the same line width (W1~W3) in the first zone Z1, the second zone Z2 and the third zone Z3, while having different spacings in the first zone Z1, the second zone Z2 and the third zone Z3. In some embodiments, the second conductive patterns 106C located in the peripheral region PR all have constant width W4, and are arranged with a constant spacing. In some embodiments, the width W4 may be greater than the widths W1~W3, or may be smaller than the widths W1~W3. In other words, the width W4 of the second conductive patterns 106C is not particularly limited, and may be adjusted based on the design requirement. In certain embodiments, the spacing of the second conductive patterns 106C in the peripheral region PR is substantially equal to the second spacing of the second sub conductive patterns 106B-2.

Although the first conductive patterns 106B and the second conductive patterns 106C are shown to have a rectangular profile from the top view, it is noted that the shape or profile of the first conductive patterns 106B and the second conductive patterns 106C are not particularly limited, and may be adjusted based on design requirements. For example, in other embodiments, the first conductive patterns 106B and the second conductive patterns 106C may have a circular profile, or may have a combination of different profile patterns.

In the exemplary embodiment, the first redistribution layer 106 is formed with three dielectric layers 106A, and having two layers of first conductive patterns 106B and two layers of second conductive patterns 106C sandwiched between the dielectric layers 106A. However, the disclosure is not limited thereto, and the numbers of the dielectric layers 106A and the number of layers of the first conductive patterns 106B and the second conductive patterns 106C included in the first redistribution layer 106 may be designated and selected based on the demand. However, for each of the layers of the first conductive patterns 106B and the second conductive patterns 106C, their pattern densities still fulfills the same requirement as described above.

In some embodiments, a material of the dielectric layers 106A is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 106A is formed by suitable fabrication techniques such as spin-on coating, chemical vapor deposition (CVD), plasma-enhanced chemical vapor deposition (PECVD) or the like. The disclosure is not limited thereto.

In some embodiments, a material of the first conductive patterns 106B and the second conductive patterns 106C are conductive materials formed by electroplating or deposition, such as aluminum, titanium, copper, nickel, tungsten, and/or alloys thereof, which may be patterned using a photolithography and etching process. In some embodiments, the first conductive patterns 106B and the second conductive patterns 106C are patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
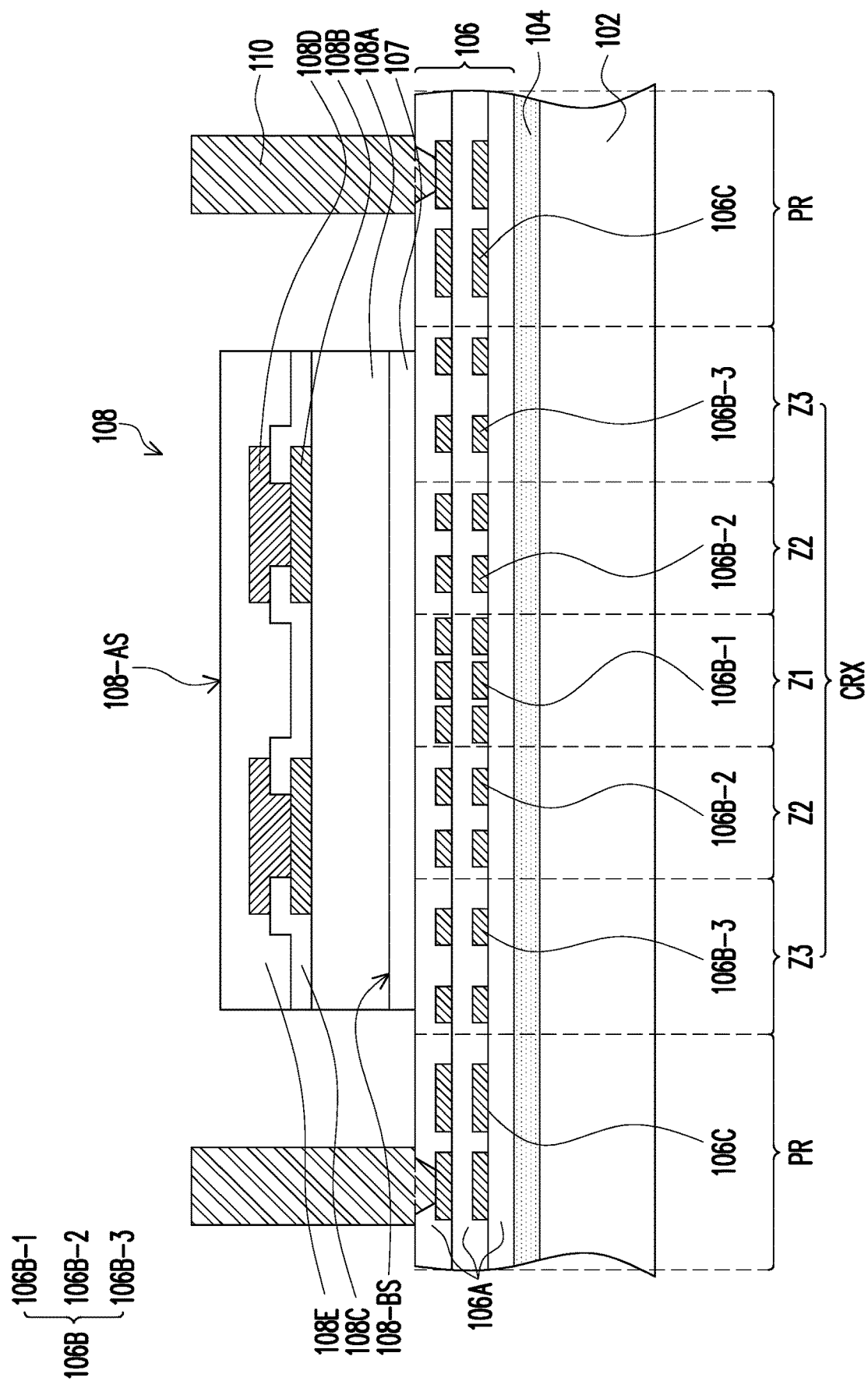

Referring to FIG. 2, after forming the first redistribution layer 106, a semiconductor die 108 is attached to the core region CRX (die bonding region) of the first redistribution layer 106 through a die attach film 107. For example, the semiconductor die 108 and the die attach film 107 are confined within a top surface area of the core region CRX, and are disposed over and overlapped with the first conductive patterns 106B. Furthermore, a plurality of through vias 110 is disposed on the peripheral region PR of the first redistribution layer 106 and electrically connected to the second conductive patterns 106C. For example, the through vias 110 surround the semiconductor die 108.

In some embodiments, the through vias 110 are through integrated fan-out ("InFO") vias. In one embodiment, the formation of the through vias 110 includes forming a mask pattern (not shown) with openings, then forming a metallic material (not shown) filling up the openings by electroplating or deposition, and removing the mask pattern to form the through vias 110 on the first redistribution layer 106. In certain embodiments, the through vias 110 fills into a via opening that reveals the second conductive patterns 106C of the first redistribution layer 106, so that the through vias 110 may be electrically connected to the first redistribution layer 106. In some embodiments, the material of the mask pattern may include a positive photo-resist or a negative photo-resist. In one embodiment, the material of the through vias 110 may include a metal material such as copper or copper alloys, or the like. However, the disclosure is not limited thereto.

In an alternative embodiment, the through vias 110 may be formed by forming a seed layer (not shown) on the first redistribution layer 106; forming the mask pattern with openings exposing portions of the seed layer; forming the metallic material on the exposed portions of the seed layer to form the through vias 110 by plating; removing the mask pattern; and then removing portions of the seed layer exposed by the through vias 110. For example, the seed layer may be a titanium/copper composited layer. For simplification, only two through vias 110 are illustrated in FIG. 2. However, it should be noted that the number of through vias 110 is not limited thereto, and can be selected based on requirement.

Furthermore, as illustrated in FIG. 2, at least one semiconductor die 108 is picked and placed on the first redistribution layer 106. In certain embodiments, the semiconductor die 108 has an active surface 108-AS, and a backside surface 108-BS opposite to the active surface 108-AS. For example, the backside surface 108-BS of the semiconductor die 108 may be attached to the first redistribution layer 106 through the die attach film 107. By using the die attach film 107, a better adhesion between the semiconductor die 108 and the first redistribution layer 106 is ensured. In the exemplary embodiment, only one semiconductor die 108 is illustrated. However, it should be noted that the number of semiconductor dies placed on the core region CRX of the first redistribution layer 106 is not limited thereto, and this can be adjusted based on design requirement.

In the exemplary embodiment, the semiconductor die 108 includes a semiconductor substrate 108A, a plurality of conductive pads 108B, a passivation layer 108C, a plurality of conductive posts 108D, and a protection layer 108E. As illustrated in FIG. 2, the plurality of conductive pads 108B is disposed on the semiconductor substrate 108A. The passivation layer 108C is formed over the semiconductor substrate 108A and has openings that partially expose the conductive pads 108B on the semiconductor substrate 108A. The semiconductor substrate 108A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 108B may be aluminum pads, copper pads or other suitable metal pads. The passivation layer 108C may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer 108C. The post-passivation layer covers the passivation layer 108C and has a plurality of contact openings. The conductive pads 108B are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 108D are formed on the conductive pads 108B by plating. In some embodiments, the protection layer 108E is formed on the passivation layer 108C or on the post passivation layer, and covering the conductive posts 108D so as to protect the conductive posts 108D.

In some embodiments, when more than one semiconductor die 108 are placed on the first redistribution layer 106, the semiconductor dies 108 may be arranged in an array within the core region CRX, and when the semiconductor dies 108 are arranged in an array, the through vias 110 may be classified into groups. The number of the semiconductor dies 108 may correspond to the number of groups of the through vias 110. In the exemplary embodiment, the semiconductor die 108 may be picked and placed on the first redistribution layer 106 after the formation of the through vias 110. However, the disclosure is not limited thereto. In some alternative embodiments, the semiconductor die 108 may be picked and placed on the first redistribution layer 106 before the formation of the through vias 110.

In some embodiments, the semiconductor die 108 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 3:
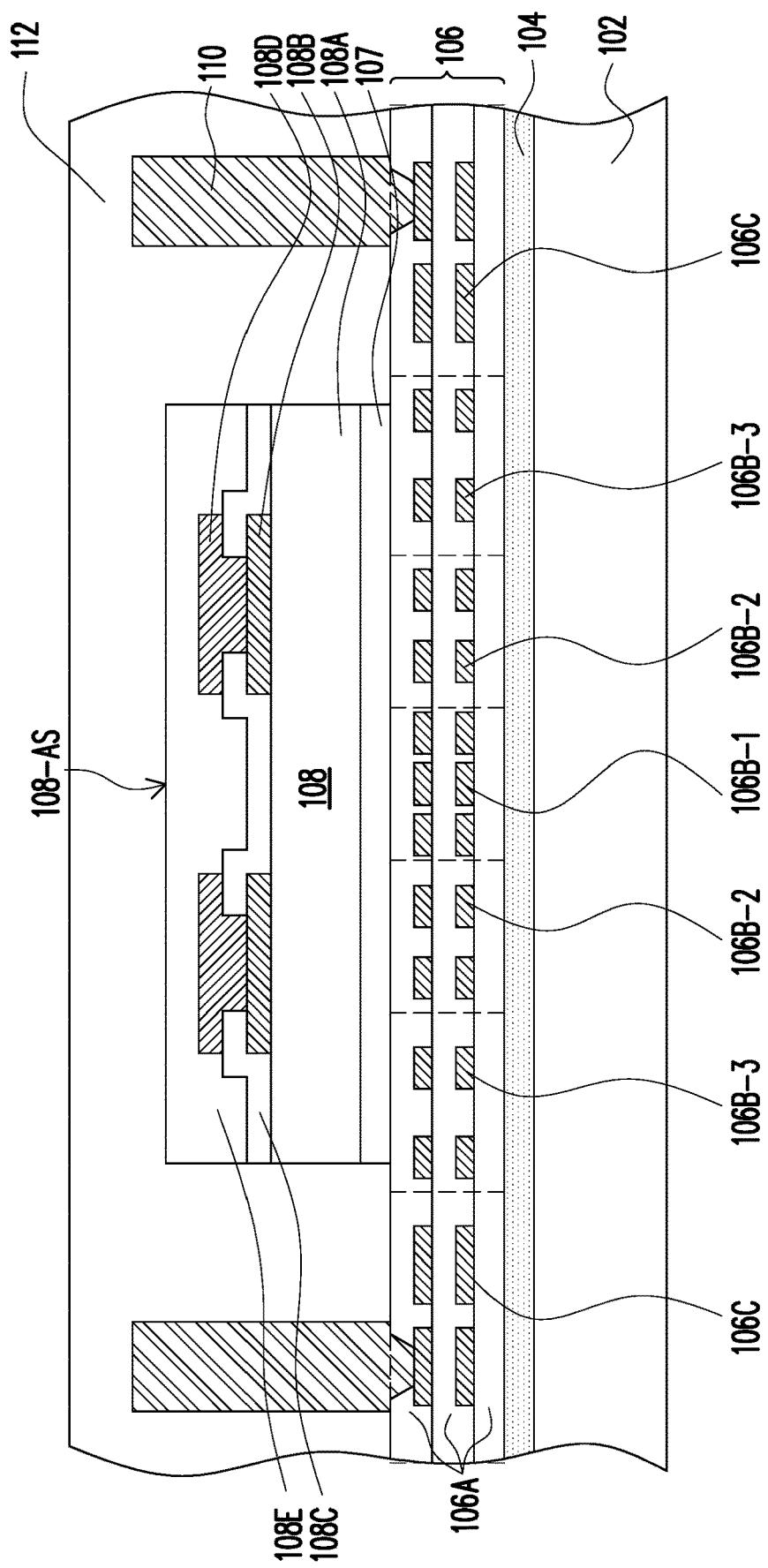

Referring to FIG. 3, an insulating material 112 is formed on the first redistribution layer 106 and over the semiconductor die 108. In some embodiments, the insulating material 112 is formed through, for example, a compression molding process, filling up the gaps between the semiconductor die 108 and the through vias 110 to encapsulate the semiconductor die 108. The insulating material 112 also fills up the gaps between adjacent through vias 110 to encapsulate the through vias 110. The conductive posts 108D and the protection layer 108E of the semiconductor die 108 are encapsulated by and well protected by the insulating material 112. In other words, the conductive posts 108D and the protection layer 108E of the semiconductor die 108 are not revealed and are well protected by the insulating material 112.

In some embodiments, the insulating material 112 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 112 may include an acceptable insulating encapsulation material. In some embodiments, the insulating material 112 may further include inorganic filler or inorganic compound (e.g. silica, clay, and so on) which can be added therein to optimize coefficient of thermal expansion (CTE) of the insulating material 112. The disclosure is not limited thereto.

Figure 4:
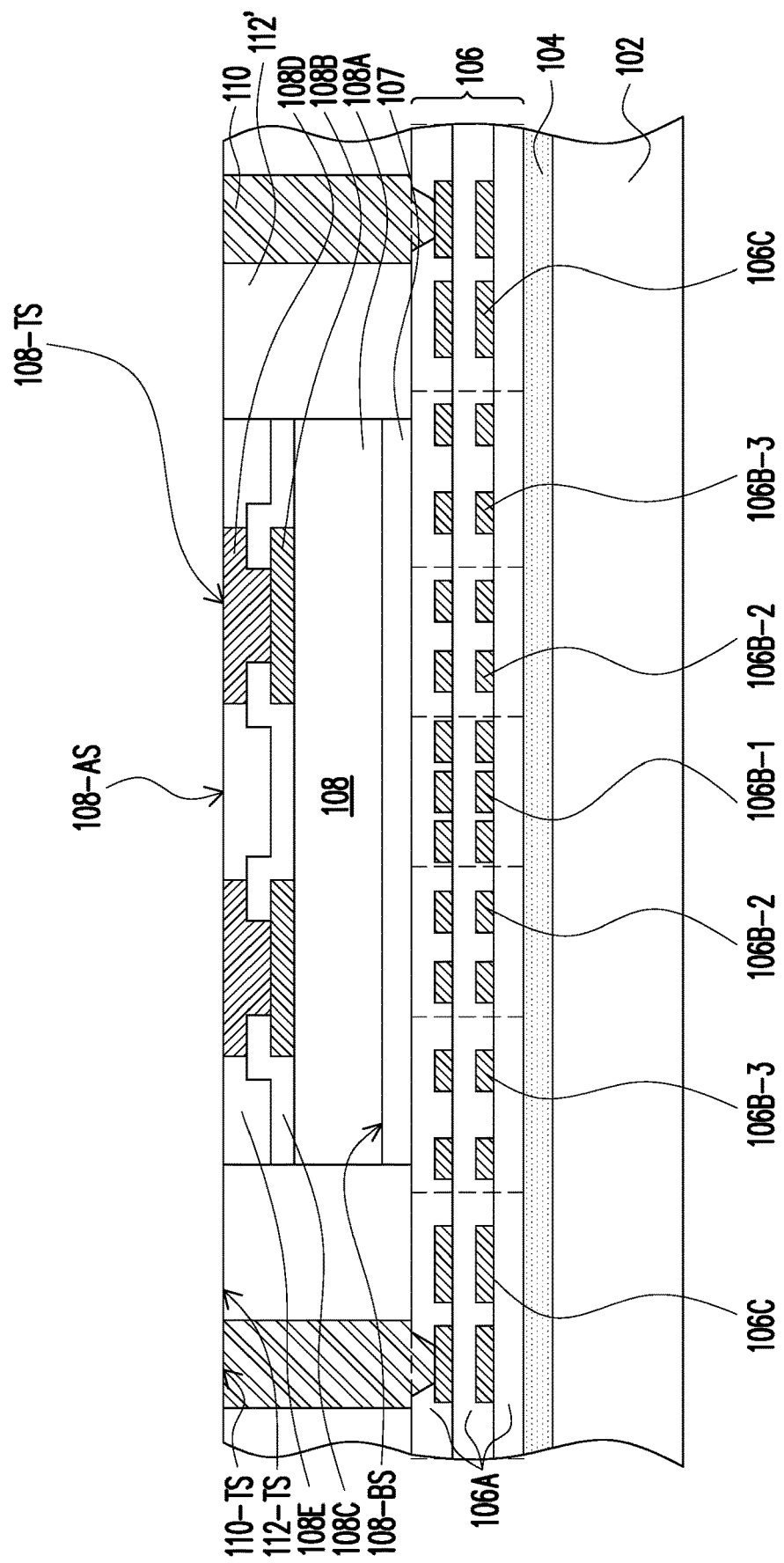

Referring to FIG. 4, in some embodiments, the insulating material 112 is partially removed to expose the conductive posts 108D and the through vias 110. In some embodiments, the insulating material 112 and the protection layer 108E are ground or polished by a planarization step. For example, the planarization step is performed through a mechanical grinding process and/or a chemical mechanical polishing (CMP) process until the top surfaces 108-TS of the conductive posts 108D are revealed. In some embodiments, the through vias 110 may be partially polished so that the top surfaces 110-TS of the through vias 110 are levelled with the top surfaces 108-TS of the conductive posts 108D, or levelled with the active surface of the semiconductor die 108. In other words, the conductive posts 108D and the through vias 110 may also be slightly grinded/polished.

In the illustrated embodiment, the insulating material 112 is polished to form an insulating encapsulant 112'. In some embodiments, the top surface 112-TS of the insulating encapsulant 112', the top surface 110-TS of the through vias 110, the top surface 108-TS of the conductive posts 108D, and the top surface of the polished protection layer 108E are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 5:
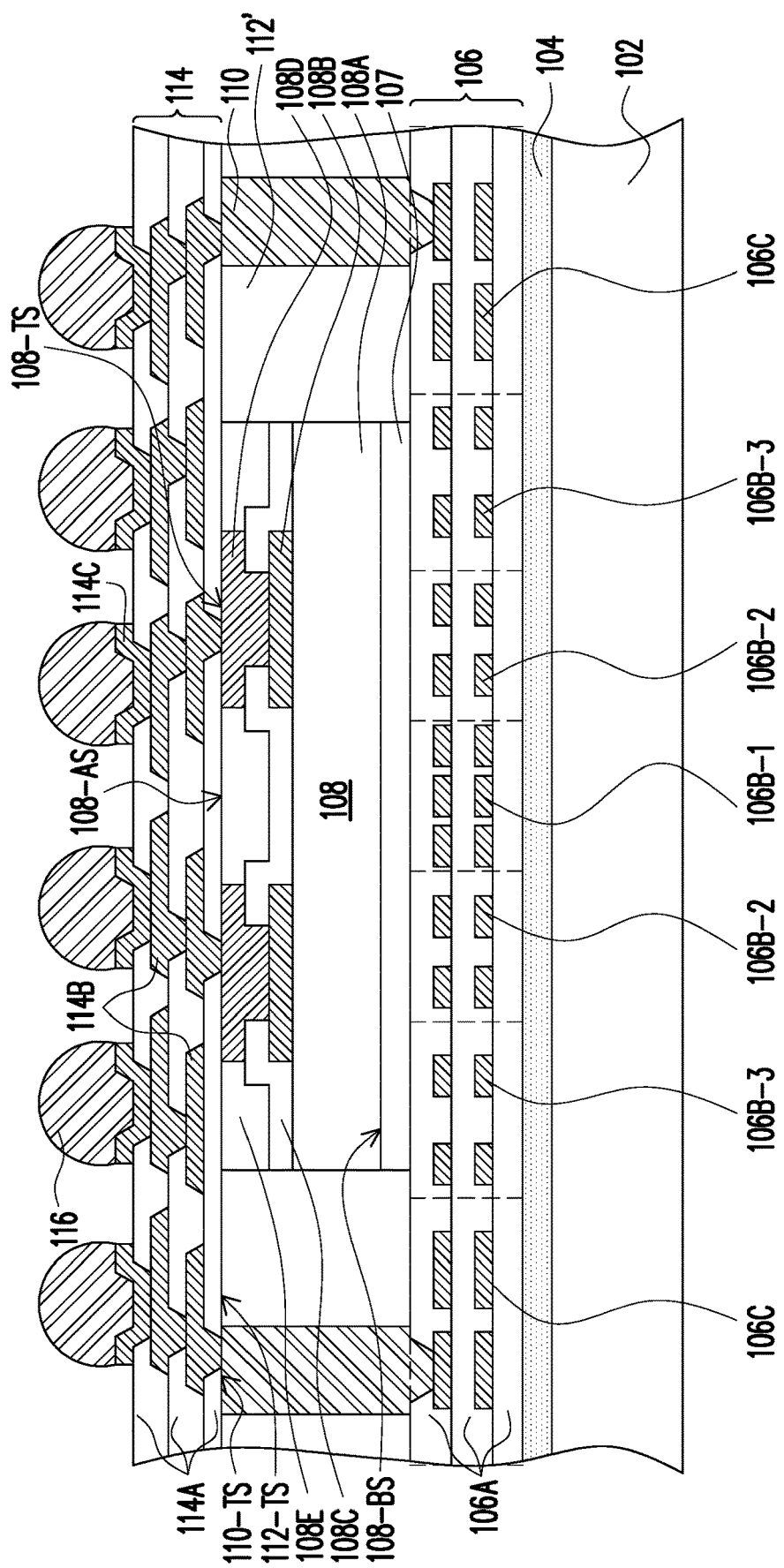

Referring to FIG. 5, after the planarization step, a second redistribution layer 114 (or top redistribution layer) is formed on the insulating encapsulant 112', the through vias 110 and the semiconductor die 108. For example, the second redistribution layer 114 is formed on the top surface 110-TS of the through vias 110, on the top surface 108-TS of the conductive posts 108D, and on the top surface 112-TS of the insulating encapsulant 112'. In some embodiments, the second redistribution layer 114 is electrically connected to the through vias 110, and is electrically connected to the semiconductor die 108 through the conductive posts 108D. In some embodiments, the semiconductor die 108 is electrically connected to the through vias 110 through the second redistribution layer 114.

In some embodiments, the formation of the second redistribution layer 114 includes sequentially forming one or more dielectric layers 114A, and one or more conductive layers 114B (or conductive patterns) in alternation. In certain embodiments, the conductive layers 114B are sandwiched between the dielectric layers 114A. Although only two layers of the conductive layers 114B and three layers of dielectric layers 114A are illustrated herein, however, the scope of the disclose is not limited by the embodiments of the disclosure. In other embodiments, the number of conductive layers 114B and the dielectric layers 114A may be adjusted based on product requirement. In some embodiments, the conductive layers 114B are electrically connected to the conductive posts 108D of the semiconductor die 108. Furthermore, the conductive layers 114B are electrically connected to the through vias 110.

In some embodiments, the materials of the dielectric layer 114A and the conductive layer 114B of the second redistribution layer 114 is similar to a material of the dielectric layer 106A and the conductive patterns (106B, 106C) mentioned for the first redistribution layer 106. Therefore, the detailed description of the dielectric layer 114A and the conductive layer 114B will be omitted herein.

After forming the second redistribution layer 114, a plurality of conductive pads 114C may be disposed on an exposed top surface of the topmost layer of the conductive layers 114B for electrically connecting with conductive balls. In certain embodiments, the conductive pads 114C are for example, under-ball metallurgy (UBM) patterns used for ball mount. As shown in FIG. 5, the conductive pads 114C are formed on and electrically connected to the second redistribution layer 114. In some embodiments, the materials of the conductive pads 114C may include copper, nickel, titanium, tungsten, or alloys thereof or the like, and may be formed by an electroplating process, for example. The number of conductive pads 114C are not limited in this disclosure, and may be selected based on the design layout. In some alternative embodiments, the conductive pads 114C may be omitted. In other words, conductive balls 116 formed in subsequent steps may be directly disposed on the second redistribution layer 114.

After forming the conductive pads 114C, a plurality of conductive balls 116 is disposed on the conductive pads 114C and over the second redistribution layer 114. In some embodiments, the conductive balls 116 may be disposed on the conductive pads 114C by a ball placement process or reflow process. In some embodiments, the conductive balls 116 are, for example, solder balls or ball grid array (BGA) balls. In some embodiments, the conductive balls 116 are connected to the second redistribution layer 114 through the conductive pads 114C. In certain embodiments, some of the conductive balls 116 may be electrically connected to the semiconductor die 108 through the second redistribution layer 114. Furthermore, some of the conductive balls 116 may be electrically connected to the through vias 110 through the second redistribution layer 114. The number of the conductive balls 116 is not limited to the disclosure, and may be designated and selected based on the number of the conductive pads 114C. In some alternative embodiments, an integrated passive device (IPD) (not shown) may optionally be disposed on the second redistribution layer 114 and electrically connected to the second redistribution layer 114.

Figure 6:
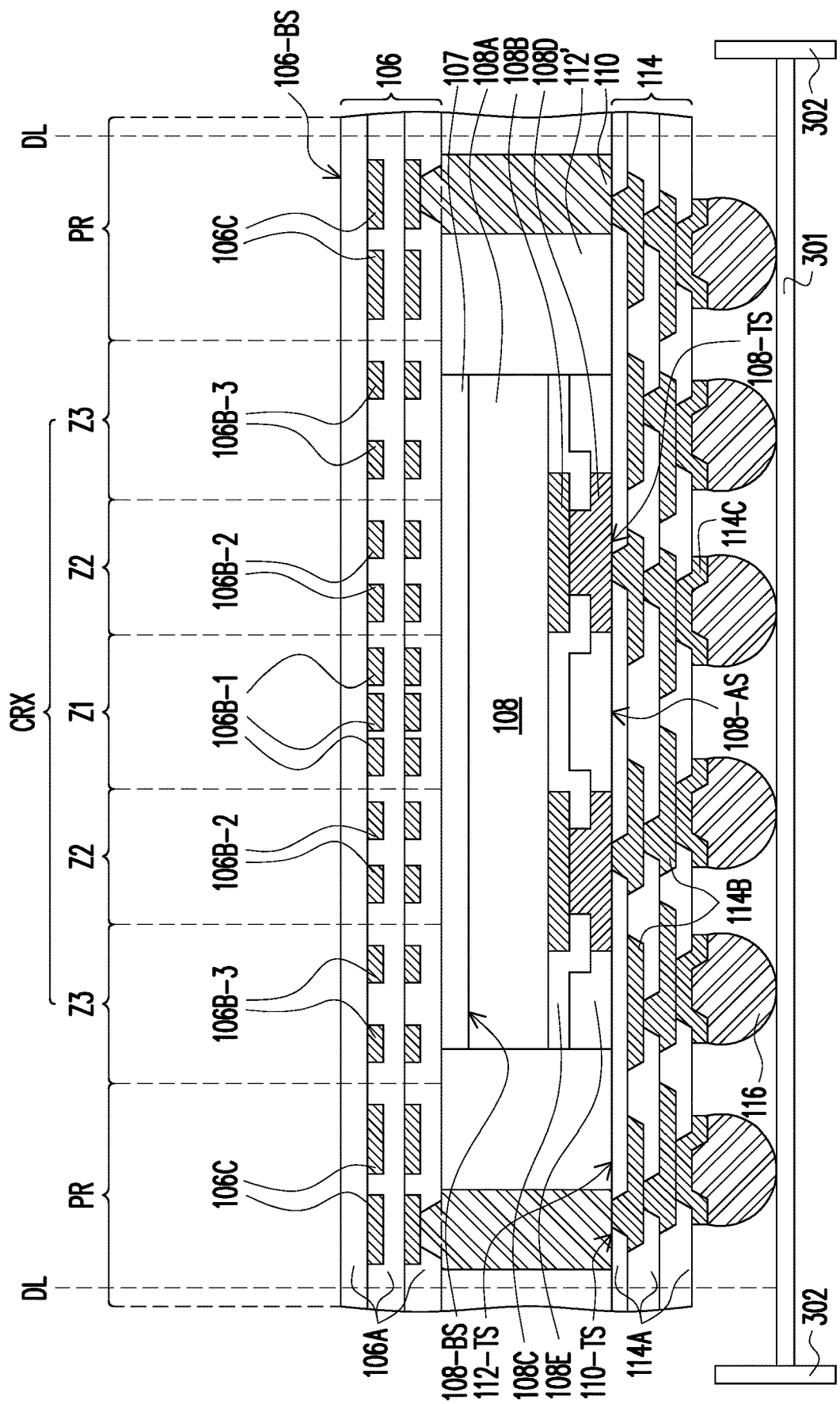

Referring to FIG. 6, after forming the second redistribution layer 114 and placing the conductive balls 116 thereon, the structure shown in FIG. 5 may be turned upside down and attached to a tape 301 (e.g., a dicing tape) supported by a frame 302. As illustrated in FIG. 6, the carrier 102 is debonded and is separated from the first redistribution layer 106. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape 301 is used to secure the package structure before de-bonding the carrier 102 and the debond layer 104. After the de-bonding process, a backside surface 106-BS of the first redistribution layer 106 is revealed or exposed. In certain embodiments, a dielectric layer 106A of the first redistribution layer 106 is revealed or exposed.

Figure 7:
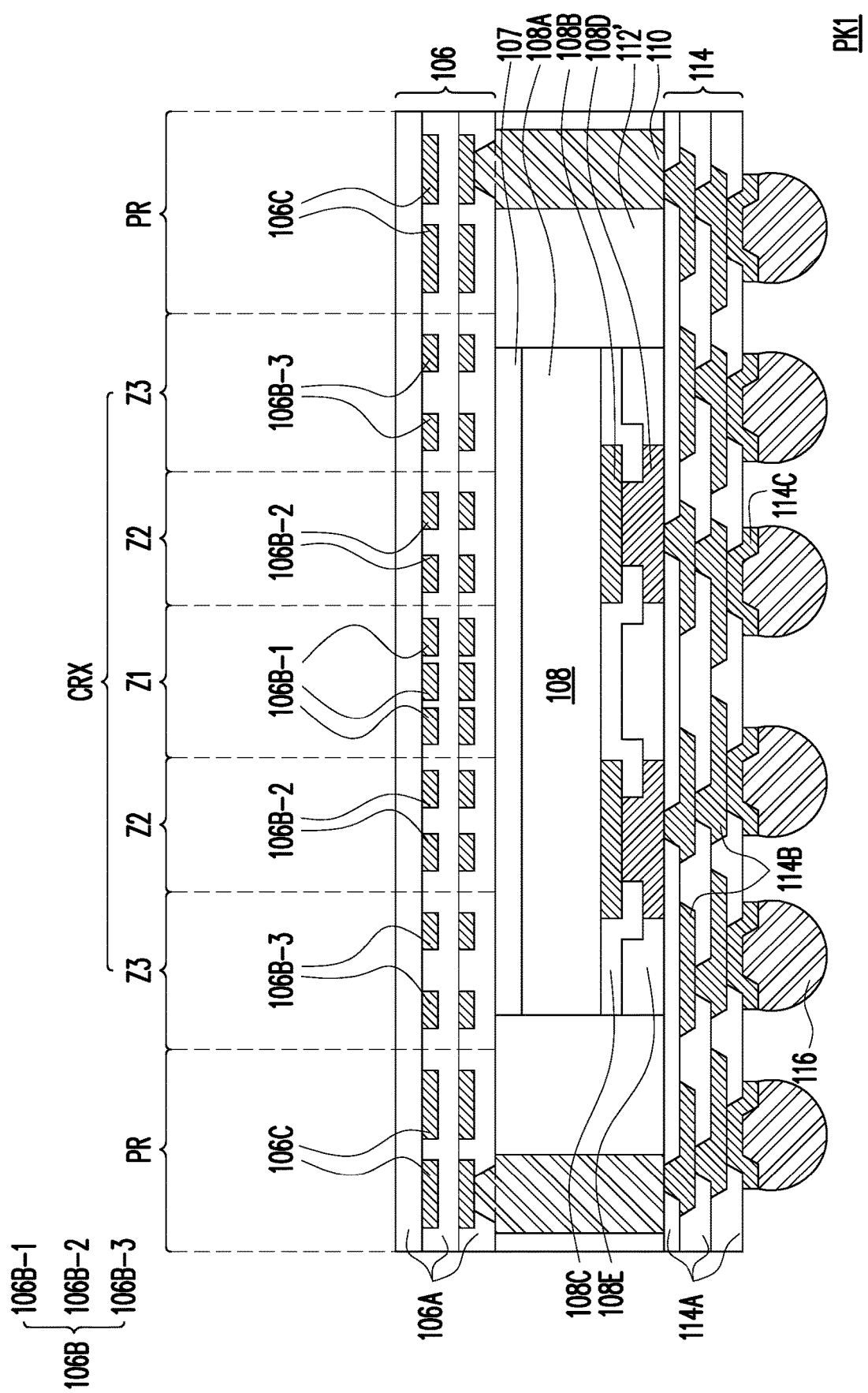

Referring to FIG. 7, after the de-bonding process, a dicing process is performed along the dicing lines DL (shown in FIG. 6) to cut the whole wafer structure (cutting through the insulating encapsulant 112', the first redistribution layers 106 and the second redistribution layer 114) into a plurality of package structures PK1. In the exemplary embodiment, the dicing process is a wafer dicing process including mechanical blade sawing or laser cutting. In a subsequent process, the separated package structures PK1 may for example, be disposed onto a circuit substrate or onto other components based on requirements. Up to here, the package structure PK1 in accordance with some embodiments of the present disclosure is accomplished.

Figure 8:
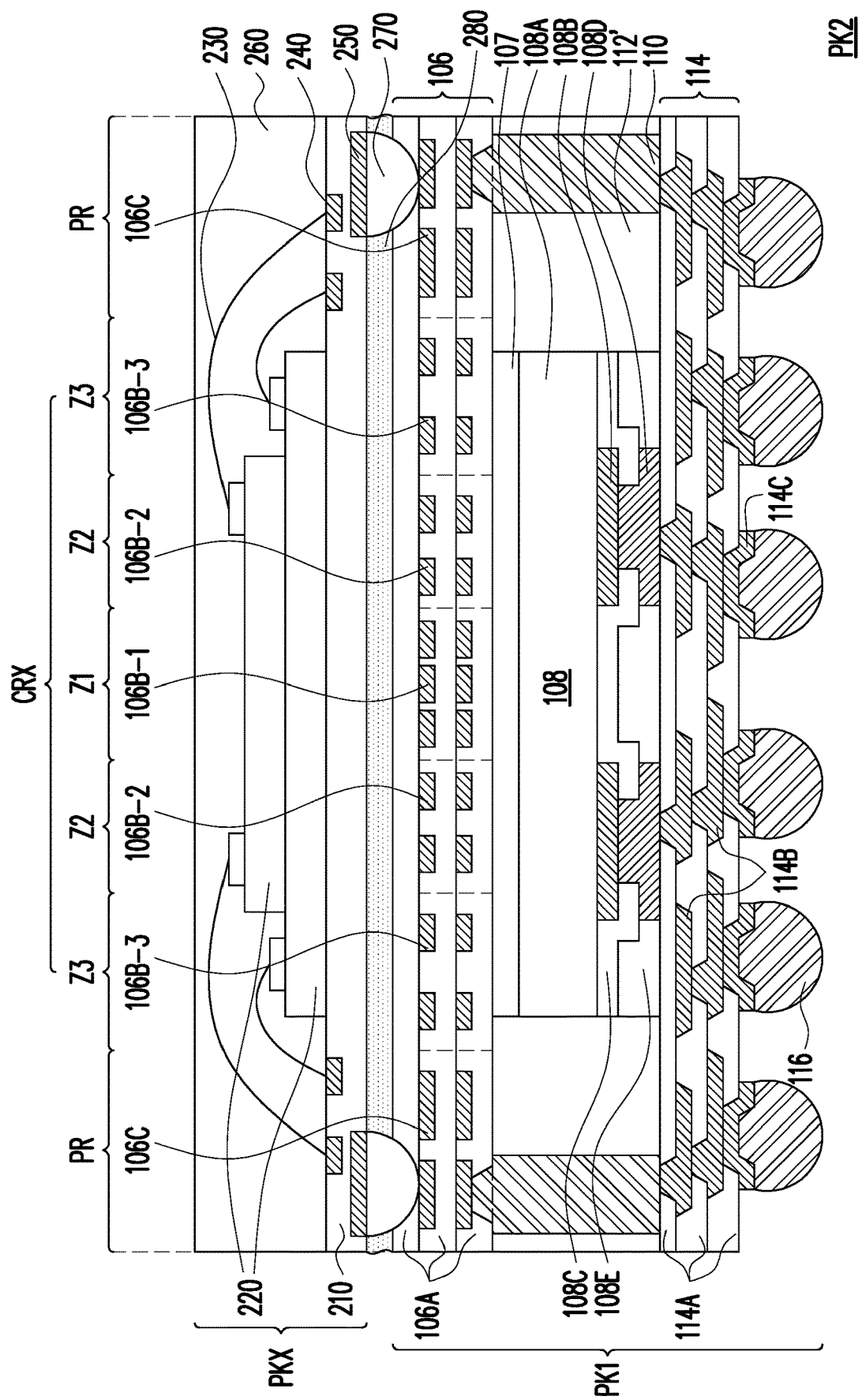
FIG. 8 is a schematic sectional view of a package structure according to some exemplary embodiments of the present disclosure.

FIG. 8 is a schematic sectional view of a package structure according to some exemplary embodiments of the present disclosure. Referring to FIG. 8, after fabricating a first package, such as the package structure PK1 illustrated in FIG. 7, a second package PKX may be stacked on the package structure PK1 (first package) so as to form a package structure PK2 or a package-on-package (PoP) structure. As illustrated in FIG. 8, the second package PKX is electrically connected to the second conductive patterns 106C in the peripheral region PR of the package structure PK1 (first package). In some embodiments, the second package PKX has a substrate 210, a plurality of semiconductor chips 220 mounted on one surface (e.g. top surface) of the substrate 210 and stacked on top of one another. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the second package PKX are electrically connected to conductive balls 270 (or conductive bumps). Furthermore, the conductive balls 270 are electrically connected to the second conductive patterns 106C of the first redistribution layer 106 in the package structure PK1 (first package). In some embodiments, an underfill structure 280 is further provided to fill in the spaces between the conductive balls 270 to protect the conductive balls 270.

After stacking the second package PKX on the package structure PK1 (first package) and providing electrical connection therebetween, a package structure PK2 or a package-on-package (PoP) structure can be fabricated. For example, in the package structure PK2, the semiconductor chips 220 are disposed on the first redistribution layer 106 and electrically connected to the second conductive patterns 106C in the peripheral region PR. Furthermore, the semiconductor chips 220 and the semiconductor die 108 are located on two opposing surfaces of the first redistribution layer 106.

Figure 9:
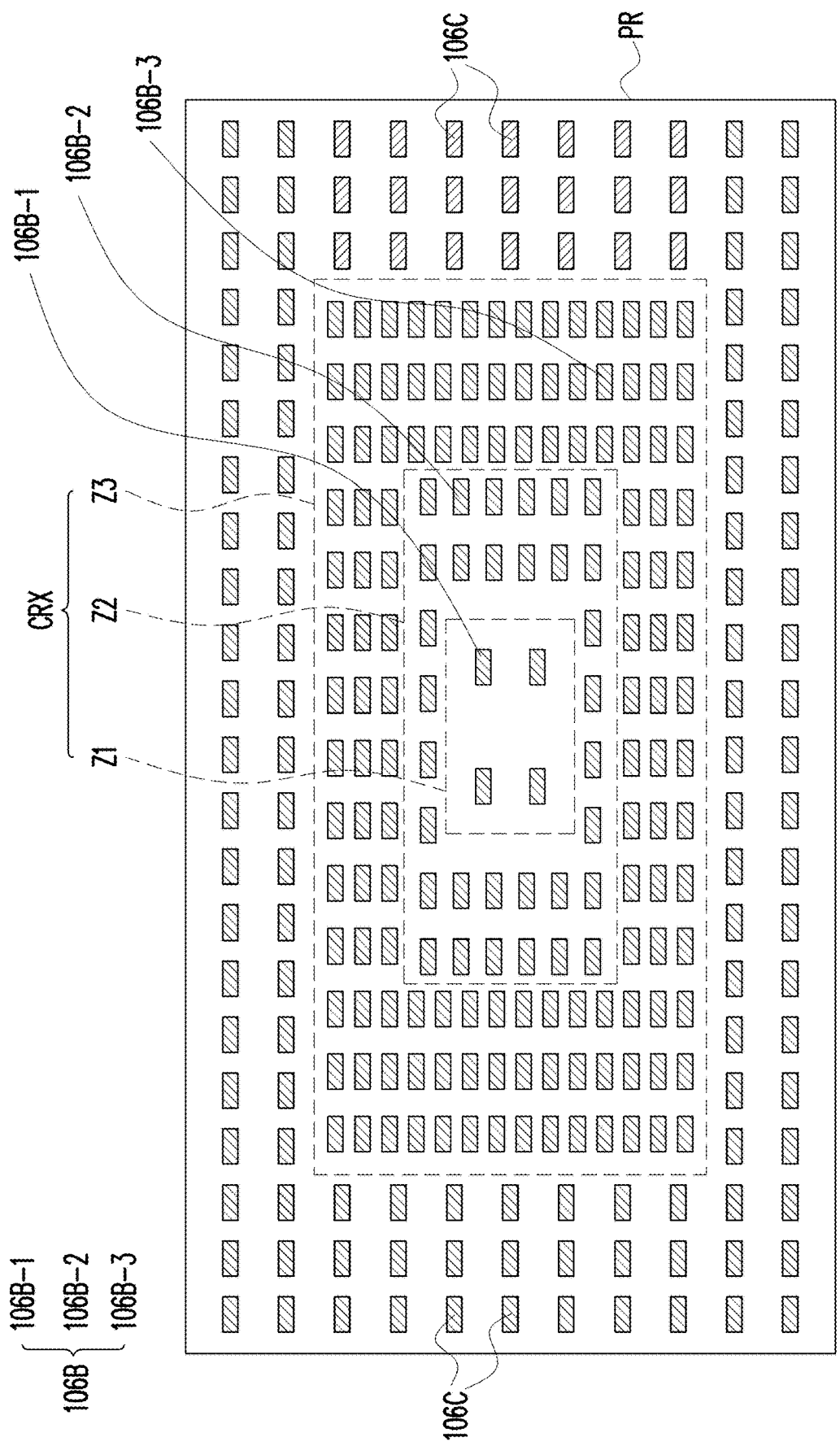
FIG. 9 is a schematic top view of a first redistribution layer according to some other embodiments of the present disclosure.

FIG. 9 is a schematic top view of a first redistribution layer according to some other embodiments of the present disclosure. The first redistribution layer 106 illustrated in FIG. 9 is similar to the first redistribution layer 106 illustrated in FIG. 1A and FIG. 1B. Therefore, the same reference numerals are used to refer to the same or liked parts, and its detailed description will be omitted herein. The difference between the embodiments is in the arrangement of the first conductive patterns 106B in the core region CRX.

For example, as illustrated in FIG. 1A and FIG. 1B, the first conductive patterns 106B are arranged in the core region CRX with a pattern density that gradually decreases from a center of the core region CRX to a boundary of the core region CRX. However, the disclosure is not limited thereto. As illustrated in FIG. 9, in some embodiments, the first conductive patterns 106B are embedded in the dielectric layers 106A in the core region CRX, and are arranged in the core region CRX with a pattern density that gradually increase from a center of the core region CRX to a boundary of the core region CRX. In other words, the first conductive patterns 106B have a less dense pattern at the center of the core region CRX, while the first conducive patterns 106B have more dense pattern at the boundary of the core region CRX. Similarly, e, the second conductive patterns 106C are embedded in the dielectric layers 106A in the peripheral region PR, and having a uniform pattern density in the peripheral region PR.

As further illustrated in FIG. 9, the first conductive patterns 106B includes a plurality of first sub conductive patterns 106B-1, a plurality of second sub conductive patterns 106B-2 and a plurality of third sub conductive patterns 106B-3. The first sub conductive patterns 106B-1 are disposed in the first zone Z1 of the core region CRX (die bonding region) and is arranged with a first pattern density D1. The second sub conductive patterns 106B-2 are disposed in the second zone Z2 of the core region CRX (die bonding region) and is arranged with a second pattern density D2. The third sub conductive patterns 106B-3 are disposed in the third zone Z3 of the core region CRX (die bonding region) and is arranged with a third pattern density D3, whereby D1≠D2≠D3. In the exemplary embodiment, the first pattern density D1 is the lowest pattern density of the first conductive patterns 106B in the core region CRX, while the third pattern density D3 is the highest pattern density of the first conductive patterns 106B in the core region CRX. For example, the first pattern density D1 is 50% of the first zone Z1, the second pattern density D2 is 60% of the second zone Z2 and the third pattern density D3 is 70% of the third zone Z3. By adjusting the pattern densities of the first conductive patterns 106B in the core region CRX to gradually increase from a center of the core region CRX to a boundary of the core region CRX as shown in FIG. 9, a high topography issue of the die bond surface can be eliminated, and the die attach film 107 may be attached onto the first redistribution layer 106 in a void-free manner. The same manufacturing steps described in FIG. 2 to FIG. 7 may be performed on the first redistribution layer 106 shown in FIG. 9 to accomplish another package structure according to some other embodiments of the present disclosure.

Figure 10:
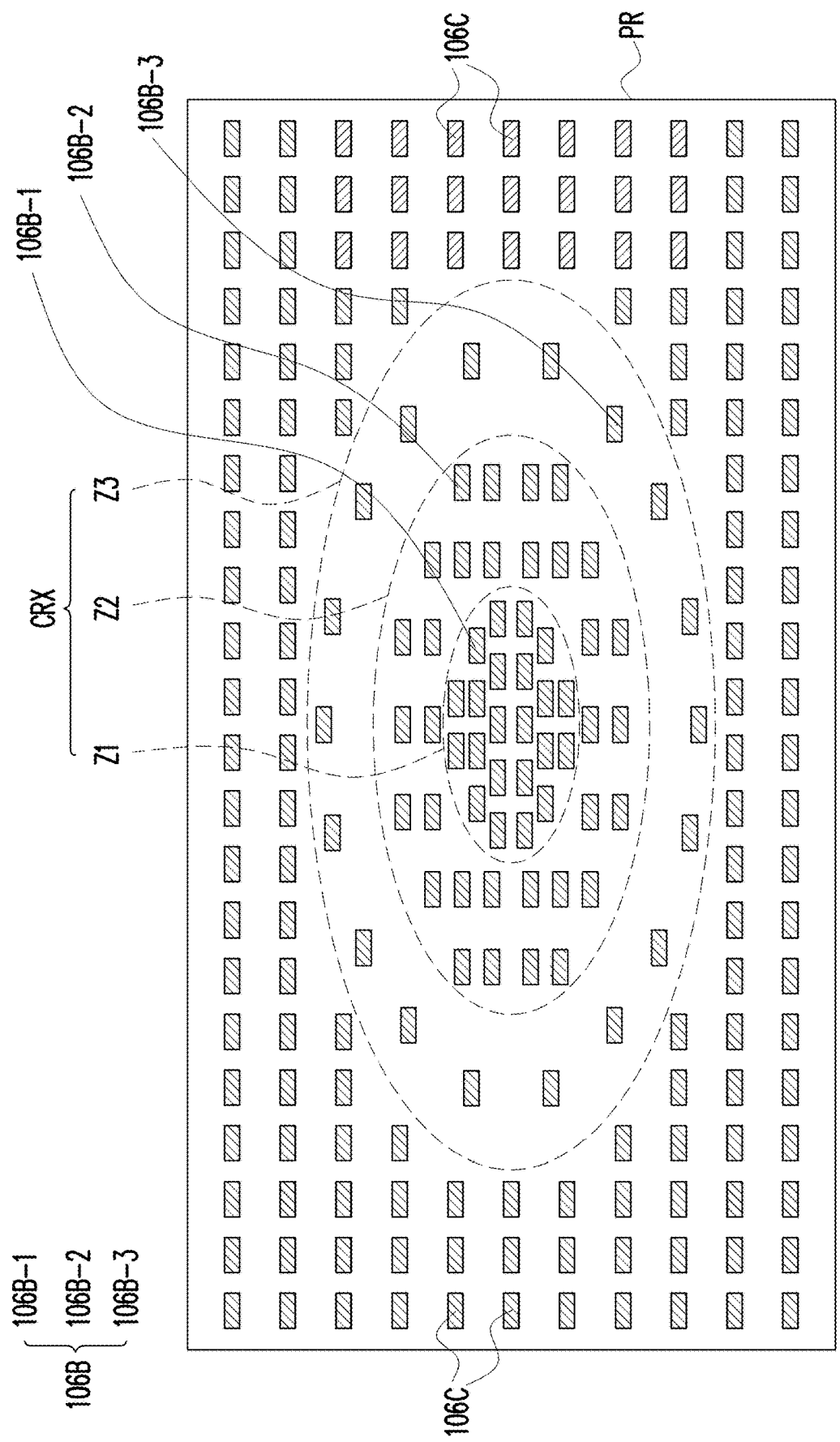
FIG. 10 is a schematic top view of a first redistribution layer according to some other embodiments of the present disclosure.

FIG. 10 is a schematic top view of a first redistribution layer according to some other embodiments of the present disclosure. The first redistribution layer 106 illustrated in FIG. 10 is similar to the first redistribution layer 106 illustrated in FIG. 1A and FIG. 1B. Therefore, the same reference numerals are used to refer to the same or liked parts, and its detailed description will be omitted herein. The difference between the embodiments is in the arrangement of the first conductive patterns 106B in the core region CRX.

Similar to the first redistribution layer 106 shown in FIG. 1A and FIG. 1B, the first redistribution layer 106 shown in FIG. 10 the first conductive patterns 106B are arranged in the core region CRX with a pattern density that gradually decreases from a center of the core region CRX to a boundary of the core region CRX. However, as illustrated in FIG. 10, the first zone Z1 has a circular shape from the top view, the second zone Z2 is encircling the first zone Z1 and has a circular shape from the top view, the third zone Z3 is encircling the first zone Z1 and second zone and has a circular shape from the top view. In other words, a shape of the zones (Z1~Z3) in the core region CRX is not particularly limited, as long as the semiconductor die 108 is bonded to the first redistribution layer 106 within a top surface area of the core region CRX.

Similar to the previous embodiments, by adjusting the pattern densities of the first conductive patterns 106B in the core region CRX to gradually decrease from a center of the core region CRX to a boundary of the core region CRX as shown in FIG. 10, a high topography issue of the die bond surface can be eliminated, and the die attach film 107 may be attached onto the first redistribution layer 106 in a void-free manner. The same manufacturing steps described in FIG. 2 to FIG. 7 may be performed on the first redistribution layer 106 shown in FIG. 10 to accomplish another package structure according to some other embodiments of the present disclosure.

For the redistribution layer 106 shown in the embodiments of FIG. 1A, FIG. 1B, FIG. 9 and FIG. 10, the core region CRX is separated into three zones (Z1~Z3). However, the disclosure is not limited thereto. In some other embodiments, the core region CRX may be separated into four zones or five zones, and the pattern densities of the first conductive patterns 106B in the core region CRX may gradually decrease/increase from a center of the core region CRX to a boundary of the core region CRX. For example, in one embodiment, if the core region CRX is separated into four zones, the pattern density may increase from a center of the core region CRX to a boundary of the core region CRX, from 50% of a first zone (center), 57% of a second zone, 64% of a third zone, to 70% of a fourth zone (boundary). In another embodiment, if the core region CRX is separated into four zones, the pattern density may decrease from a center of the core region CRX to a boundary of the core region CRX, from 70% of a first zone (center), 64% of a second zone, 57% of a third zone, to 50% of a fourth zone (boundary). In some other embodiments, the core region CRX may include a plurality of zones (Z1 to Zx), whereby the pattern density may increase or decrease gradually by 1% increment/decrement to a next zone in the range of 50%-70% pattern densities, from a center of the core region CRX to a boundary of the core region CRX.

Figure 11C:
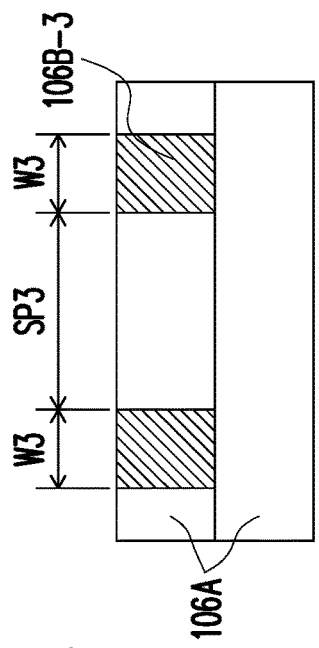
FIG. 11A to FIG. 11C are respectively illustrating a first zone, a second zone and a third zone of a core region in the first redistribution layer according to some embodiments of the present disclosure.
Figure 11B:
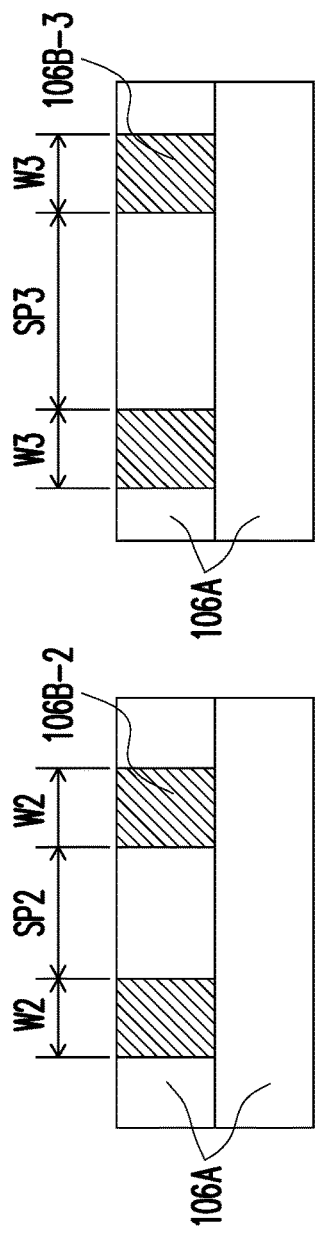
Figure 11A:
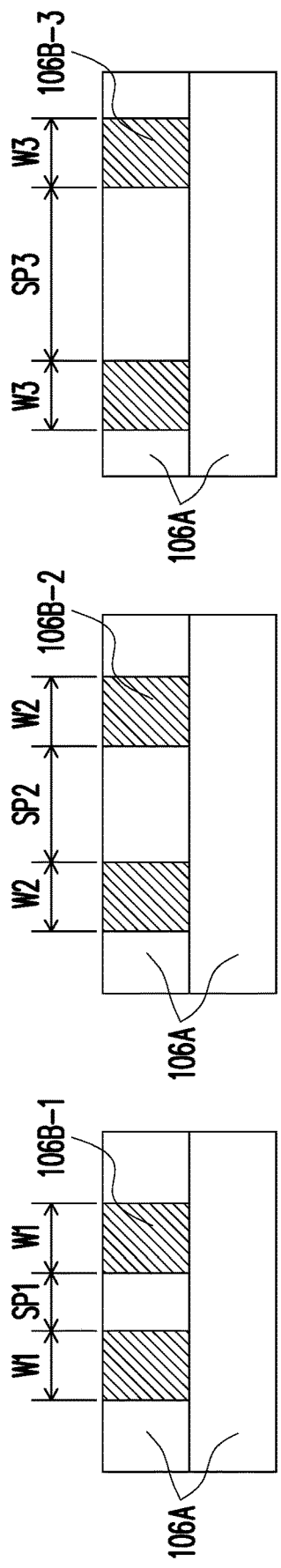

FIG. 11A to FIG. 11C are respectively illustrating a first zone Z1, a second zone Z2, and a third zone Z3 of a core region CRX in the first redistribution layer 106 according to some embodiments of the present disclosure. In the above embodiments, when the pattern densities of the first conductive patterns 106B in the core region CRX are arranged to gradually increase or decrease from a center of the core region CRX to a boundary of the core region CRX, the first conductive patterns 106B may have the same line width and have different spacings in each of the zones. For example, as illustrated in FIG. 11A to FIG. 11C, the first sub conductive patterns 106B-1 are arranged with a first width W1 and spaced apart by a first spacing SP1 in the first zone Z1. The second sub conductive patterns 106B-2 are arranged with a second width W2 and spaced apart by a second spacing SP2 in the second zone Z2. The third sub conductive patterns 106B-3 are arranged with a third width W3 and spaced apart by a third spacing SP3 in the third zone Z3. In some embodiments, the first width W1, the second width W2 and the third width W3 are substantially equal to one other. Furthermore, the first spacing SP1 is smaller than the second spacing SP2, while the second spacing SP2 is smaller than the third spacing SP3. By adjusting the spacings (SP1~SP3) of the first conductive patterns 106B with equal line widths, the first conductive patterns 106B may have different pattern densities in each of the zones.

Figure 12C:
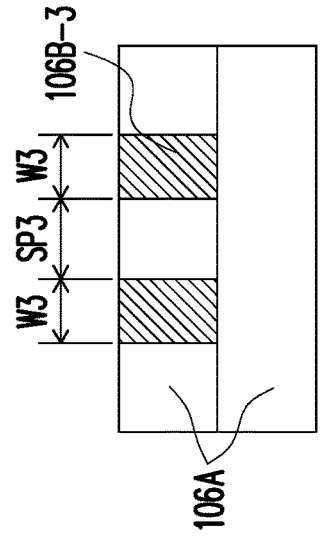
FIG. 12A to FIG. 12C are respectively illustrating a first zone, a second zone and a third zone of a core region in the first redistribution layer according to some other embodiments of the present disclosure.
Figure 12B:
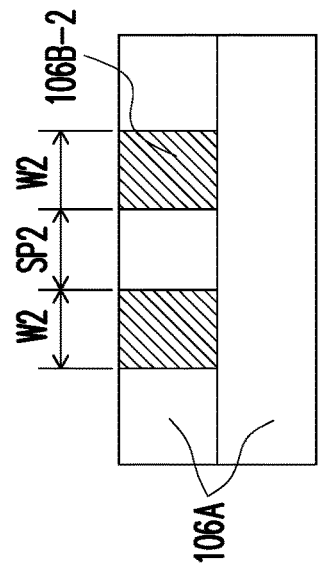
Figure 12A:
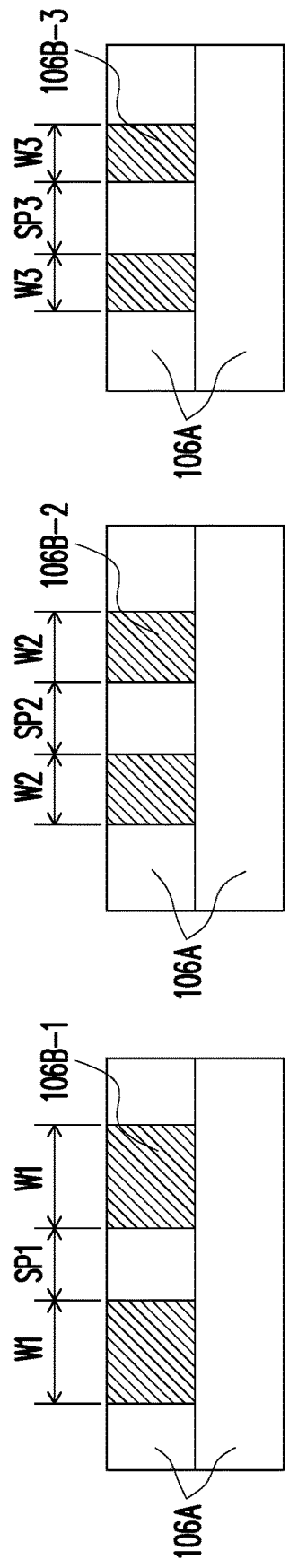

FIG. 12A to FIG. 12C are respectively illustrating a first zone Z1, a second zone Z2, and a third zone Z3 of a core region CRX in the first redistribution layer 106 according to some other embodiments of the present disclosure. In the above embodiments, when the pattern densities of the first conductive patterns 106B in the core region CRX are arranged to gradually increase or decrease from a center of the core region CRX to a boundary of the core region CRX, the first conductive patterns 106B may have different line widths and have the same spacing in each of the zones. For example, as illustrated in FIG. 12A to FIG. 12C, the first sub conductive patterns 106B-1 are arranged with a first width W1 and spaced apart by a first spacing SP1 in the first zone Z1. The second sub conductive patterns 106B-2 are arranged with a second width W2 and spaced apart by a second spacing SP2 in the second zone Z2. The third sub conductive patterns 106B-3 are arranged with a third width W3 and spaced apart by a third spacing SP3 in the third zone Z3. In some embodiments, the first width W1 is greater than the second width W2, while the second width W2 is greater than the third width W3. Furthermore, the first spacing SP1, the second spacing SP2, and the third spacing SP3 are substantially equal to one another. By adjusting the line widths (W1~W3) of the first conductive patterns 106B with equal spacings, the first conductive patterns 106B may have different pattern densities in each of the zones.

Figure 13:
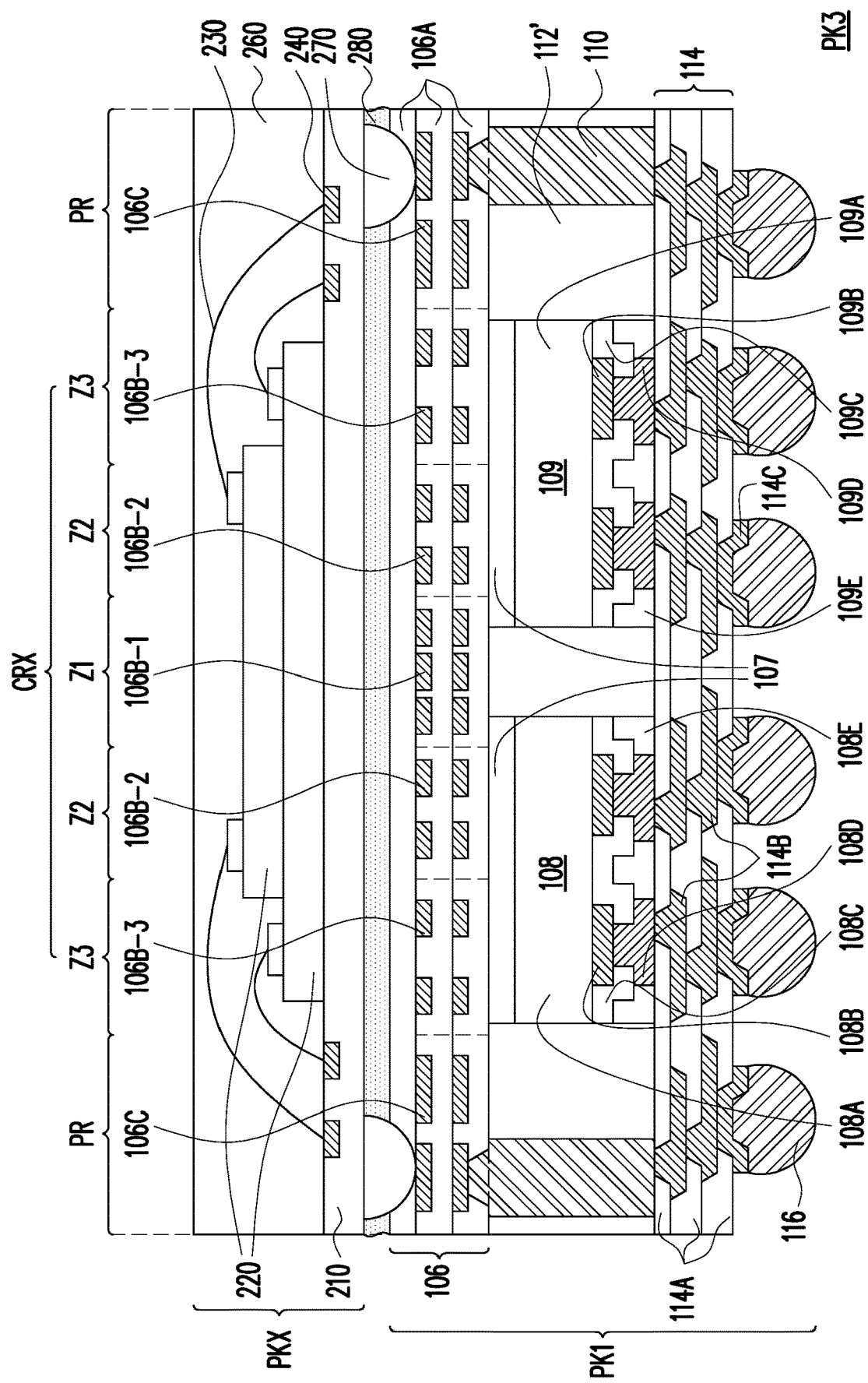
FIG. 13 is a schematic sectional view of a package structure according to some other embodiments of the present disclosure.

FIG. 13 is a schematic sectional view of a package structure according to some other embodiments of the present disclosure. The package structure PK3 illustrated in FIG. 13 is similar to the package structure PK2 illustrated in FIG. 8. Therefore, the same reference numerals are used to refer to the same or liked parts, and its detailed description will be omitted herein. In the previous embodiments, only one semiconductor die 108 is attached to the core region CRX of the first redistribution layer 106. However, the disclosure is not limited thereto. For example, as illustrated in FIG. 13, the semiconductor die 108 and a second semiconductor die 109 are disposed on the core region CRX of the first redistribution layer 106.

In the exemplary embodiment, the second semiconductor die is disposed aside the semiconductor die 108, and includes a semiconductor substrate 109A, a plurality of conductive pads 109B, a passivation layer 109C, a plurality of conductive posts 109D, and a protection layer 109E. As illustrated in FIG. 13, the plurality of conductive pads 109B is disposed on the semiconductor substrate 109A. The passivation layer 109C is formed over the semiconductor substrate 109A and has openings that partially expose the conductive pads 109B on the semiconductor substrate 109A. The semiconductor substrate 109A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 109B may be aluminum pads, copper pads or other suitable metal pads. The passivation layer 109C may be a silicon oxide layer, a silicon nitride layer, a silicon oxynitride layer or a dielectric layer formed of any suitable dielectric materials. Furthermore, in some embodiments, a post-passivation layer (not shown) is optionally formed over the passivation layer 108C. The post-passivation layer covers the passivation layer 109C and has a plurality of contact openings. The conductive pads 109B are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 109D are formed on the conductive pads 109B by plating. In some embodiments, the protection layer 109E is formed on the passivation layer 109C or on the post passivation layer, and covering the conductive posts 109D so as to protect the conductive posts 109D.

Similar to the previous embodiments, by adjusting the pattern densities of the first conductive patterns 106B in the core region CRX to gradually decrease or increase from a center of the core region CRX to a boundary of the core region CRX in the package structure PK3 of FIG. 13, a high topography issue of the die bond surface can be eliminated, and the die attach film 107 of the respective semiconductor dies (108/109) may be attached onto the first redistribution layer 106 in a void-free manner.

Figure 14:
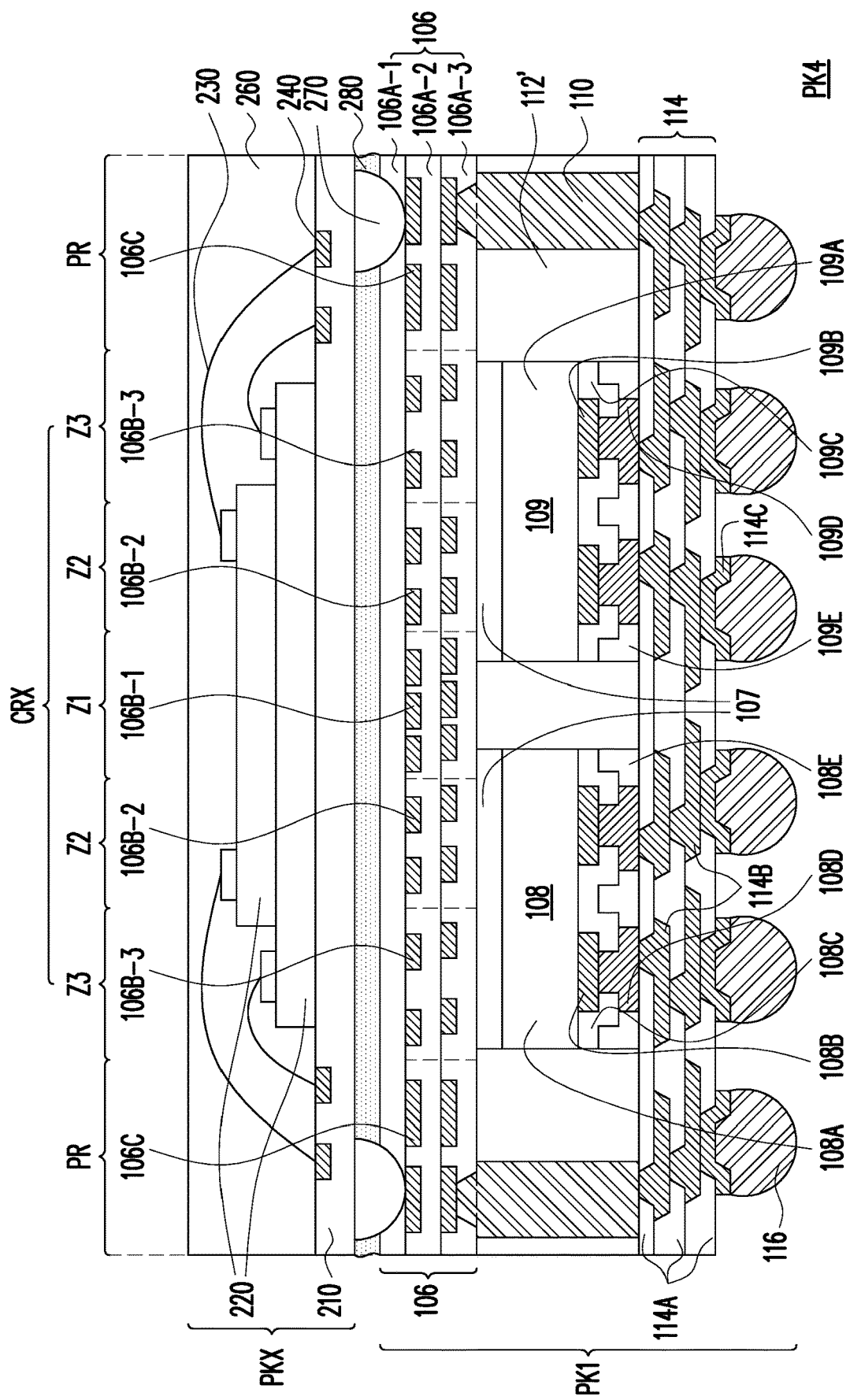
FIG. 14 is a schematic sectional view of a package structure according to some other embodiments of the present disclosure.

FIG. 14 is a schematic sectional view of a package structure according to some other embodiments of the present disclosure. The package structure PK4 illustrated in FIG. 14 is similar to the package structure PK3 illustrated in FIG. 13. Therefore, the same reference numerals are used to refer to the same or liked parts, and its detailed description will be omitted herein. The difference between the embodiments is in the design of the first redistribution layer 106.

As illustrated in FIG. 13, the first conductive patterns 106B are arranged in the core region CRX so that each of the layers of the first conductive patterns 106B have overlapping patterns. However, the disclosure is not limited thereto. For example, as illustrated in FIG. 14, the dielectric layers 106A includes a first dielectric layer 106A-1, a second dielectric layer 106A-2 and a third dielectric layer 106A-3. In some embodiments, the first conductive patterns 106B located in between the first dielectric layer 106A-1 and the second dielectric layer 106A-2 have a partially staggered arrangement with respect to the first conductive patterns 106B located in between the second dielectric layer 106A-2 and the third dielectric layer 106A-3. In other words, the first conductive patterns 106B located in between the first dielectric layer 106A-1 and the second dielectric layer 106A-2 may be partially overlapped with the first conductive patterns 106B located in between the second dielectric layer 106A-2 and the third dielectric layer 106A-3.

In such embodiment, the first conductive patterns 106B in the first zone Z1, the second zone Z2 and the third zone Z3 still fulfill the requirement where the pattern densities gradually decrease or increase from a center of the core region CRX to a boundary of the core region CRX. By adjusting the pattern densities of the first conductive patterns 106B in the core region CRX to gradually decrease or increase from a center of the core region CRX to a boundary of the core region CRX in the package structure PK3 of FIG. 13, a high topography issue of the die bond surface can be eliminated, and the die attach film 107 of the respective semiconductor dies (108/109) may be attached onto the first redistribution layer 106 in a void-free manner.

Figure 15:
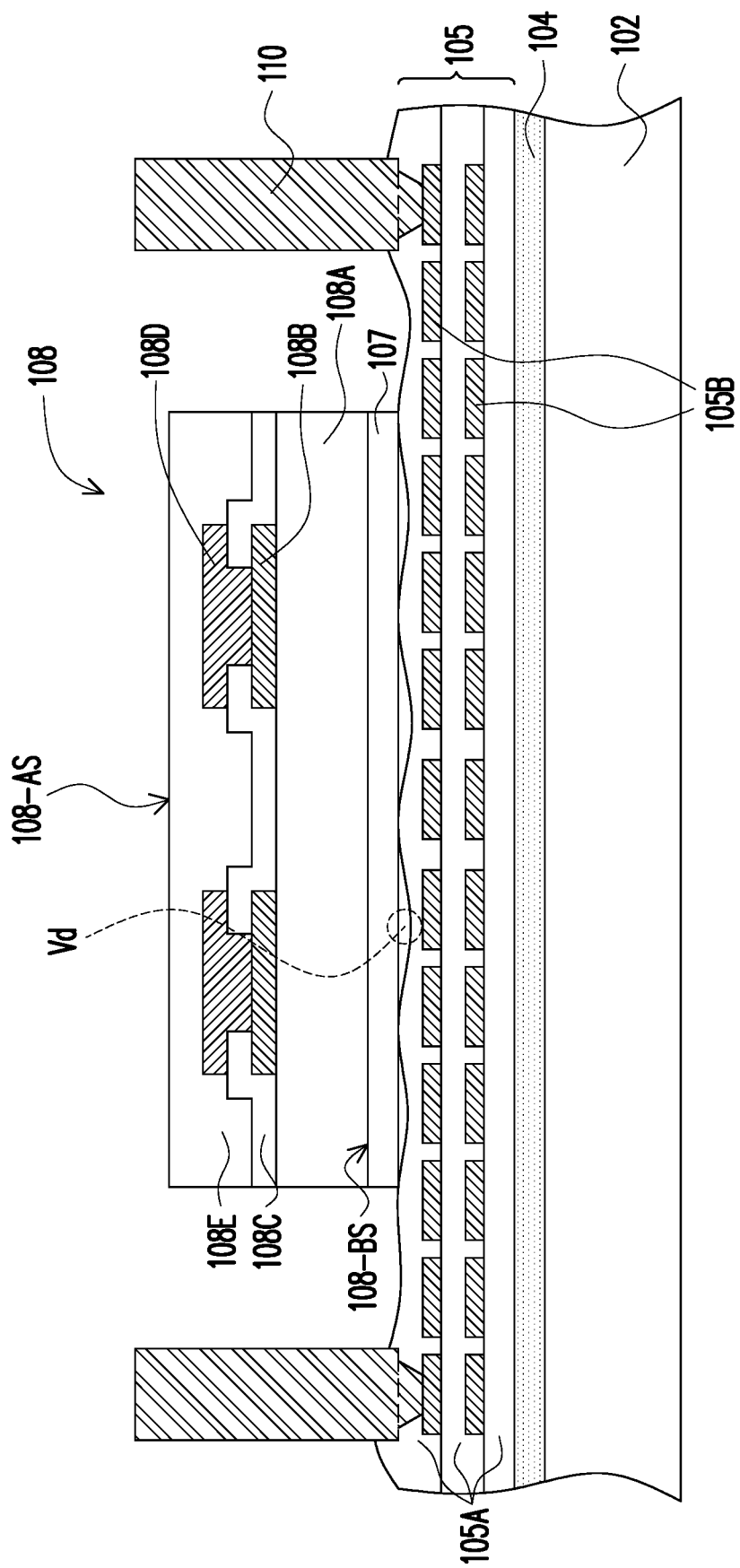
FIG. 15 is a schematic sectional view of one stage of manufacturing a package structure according to some comparative embodiment of the present disclosure.

FIG. 15 is a schematic sectional view of one stage of manufacturing a package structure according to some comparative embodiment of the present disclosure. The intermediate structure illustrated in FIG. 15 is similar to the intermediate structure illustrated in FIG. 2. Therefore, the same reference numerals are used to refer to the same or liked parts, and its detailed description will be omitted herein. The difference between the embodiments is in the design of the first redistribution layer.

As illustrated in FIG. 15, in the comparative embodiment, the first redistribution layer 105 includes one or more dielectric layers 105A and one or more conductive patterns 105B alternately stacked. The materials of the dielectric layers 105A and the conductive patterns 105B may be similar to the materials of the dielectric layers 106A, and the materials of the first conductive patterns 106B and second conductive patterns 106C described previously. Thus, its detailed description will be omitted herein. However, unlike the embodiment shown in FIG. 2, the conductive patterns 105B shown in FIG. 15 are arranged in a uniform manner across the first redistribution layer 105. In other words, the conductive patterns 105B are not arranged with pattern densities that gradually decrease or increase from a center of the core region CRX to a boundary of the core region CRX. In such comparative embodiment, the top surface of the first redistribution layer 105 may have a high topography, or have uneven die bond surfaces. As such, when the semiconductor die 108 is bonded to the first redistribution layer 105, there may be voids Vd that exists between the die attach film 107 and a top surface of the first redistribution layer 105. Overall, the performance of the die bonding process is deteriorated, and there will be reliability issues in the formed package structure.

In the above-mentioned embodiments, the package structure includes a first redistribution layer having a plurality of first conductive patterns embedded in the dielectric layers in the core region, wherein the first conductive patterns are arranged in the core region with a pattern density that gradually increases or decreases from a center of the core region to a boundary of the core region. As such, a high topography issue of a die bonding surface on the first redistribution layer can be eliminated, and the die attach film of respective semiconductor dies may be attached onto the first redistribution layer in a void-free manner. Overall, the die bonding process has an improved process window, and the obtained package structure has higher reliability without impacting the thermal-mechanical and electrical performance.

In accordance with some embodiments of the present disclosure, a package structure includes a first redistribution layer, a semiconductor die, and a plurality of through vias. The first redistribution layer has a core region and a peripheral region surrounding the core region, and the first redistribution layer includes a plurality of dielectric layers, a plurality of first conductive patterns, and a plurality of second conductive patterns. The dielectric layers are located in the core region and the peripheral region. The first conductive patterns are embedded in the dielectric layers in the core region, wherein the first conductive patterns are arranged in the core region with a pattern density that gradually increases from a center of the core region to a boundary of the core region, or arranged in the core region with a pattern density that gradually decreases from the center of the core region to the boundary of the core region. The second conductive patterns are embedded in the dielectric layers in the peripheral region. The semiconductor die is disposed on the core region over the first conductive patterns. The through vias are disposed on the peripheral region and electrically connected to the second conductive patterns.

In accordance with some other embodiments of the present disclosure, a package structure includes a backside redistribution layer, at least one semiconductor die, a top redistribution layer and a plurality of conductive terminals. The backside redistribution layer has a die bonding region and a peripheral region surrounding the die bonding region. The die bonding region includes a plurality of first sub conductive patterns, a plurality of second sub conductive patterns and a plurality of third subs conductive patterns. The first sub conductive patterns are disposed in a first zone of the die bonding region and having a first pattern density $D1$. The second sub conductive patterns are disposed in a second zone of the die bonding region and having a second pattern density $D2$. The third sub conductive patterns are disposed in a third zone of the die bonding region and having a third pattern density $D3$, wherein the third zone is separated from the first zone by the second zone, and wherein $D1 \neq D2 \neq D3$. The semiconductor die is attached to the die bonding region through a die attach film. The top redistribution layer is disposed on the at least one semiconductor die and electrically connected to the backside redistribution layer from the peripheral region. The conductive terminals is disposed on and electrically connected to the top redistribution layer.

In accordance with yet another embodiment of the present disclosure, a method of fabricating a package structure is described. The method includes the following steps. A first redistribution layer having a core region and a peripheral region is formed to surround the core region on the carrier. The formation of the first redistribution layer includes: forming a plurality of dielectric layers located in the core region and the peripheral region; forming a plurality of first conductive patterns embedded in the plurality of dielectric layers in the core region, wherein the plurality of first conductive patterns is arranged in the core region with a pattern density that gradually increases from a center of the core region to a boundary of the core region, or arranged in the core region with a pattern density that gradually decreases from the center of the core region to the boundary of the core region; and forming a plurality of second conductive patterns embedded in the plurality of dielectric layers in the peripheral region. A semiconductor die is placed on the core region over the plurality of first conductive patterns. A plurality of through vias is formed on the peripheral region and electrically connected to the plurality of second conductive patterns. A second redistribution layer is formed on the semiconductor die and the plurality of through vias, wherein the second redistribution layer is electrically connected to the first redistribution layer by the plurality of through vias. The carrier is debonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first redistribution layer having a core region and a peripheral region surrounding the core region, wherein the first redistribution layer comprises:
   a first dielectric layer and a second dielectric layer stacked on the first dielectric layer, wherein the first dielectric layer and the second dielectric layer are located in the core region and the peripheral region;
   a plurality of first conductive patterns embedded in the first dielectric layer and the second dielectric layer in the core region, wherein the plurality of first conductive patterns is arranged in the core region with a pattern density that gradually increases from a center of the core region to a boundary of the core region, or arranged in the core region with a pattern density that gradually decreases from the center of the core region to the boundary of the core region; and
   a plurality of second conductive patterns embedded in the first dielectric layer and the second dielectric layer in the peripheral region;
   a semiconductor die disposed on the core region over the plurality of first conductive patterns and overlapped with the plurality of first conductive patterns; and
   a plurality of through vias disposed on the peripheral region and electrically connected to the plurality of second conductive patterns.

2. The package structure according to claim 1, wherein the plurality of second conductive patterns has uniform pattern density in the peripheral region.

3. The package structure according to claim 1, wherein the core region comprises a first zone where the plurality of first conductive patterns is arranged with a first pattern density $D1$, a second zone encircling the first zone where the plurality of first conductive patterns is arranged with a second pattern density $D2$, and a third zone encircling the second zone and the first zone where the plurality of first conductive patterns is arranged with a third pattern density $D3$, and wherein the first pattern density $D1$ in the first zone or the third pattern density $D3$ in the third zone is the highest pattern density in the core region.

4. The package structure according to claim 3, wherein the first pattern density $D1$ is 50% of the first zone, the second pattern density $D2$ is 60% of the second zone and the third pattern density $D3$ is 70% of the third zone.

5. The package structure according to claim 3, wherein the first pattern density $D1$ is 70% of the first zone, the second pattern density $D2$ is 60% of the second zone and the third pattern density $D3$ is 50% of the third zone.

6. The package structure according to claim 3, wherein the plurality of first conductive patterns have the same line width in the first zone, the second zone and the third zone, while having different spacings in the first zone, the second zone and the third zone.

7. The package structure according to claim 3, wherein the plurality of first conductive patterns have the same spacing in the first zone, the second zone and the third zone, while having different line width in the first zone, the second zone and the third zone.

8. A package structure, comprising:
- a backside redistribution layer having a die bonding region and a peripheral region surrounding the die bonding region, wherein the die bonding region comprises:
  - a plurality of first sub conductive patterns disposed in a first zone of the die bonding region and having a first pattern density D1;
  - a plurality of second sub conductive patterns disposed in a second zone of the die bonding region and having a second pattern density D2; and
  - a plurality of third sub conductive patterns disposed in a third zone of the die bonding region and having a third pattern density D3, wherein the third zone is separated from the first zone by the second zone, and wherein D1≠D2≠D3;
- at least one semiconductor die attached to the die bonding region through a die attach film, wherein the at least one semiconductor die and the die attach film are overlapped with the plurality of first sub conductive patterns, the plurality of second sub conductive patterns and the plurality of third sub conductive patterns;
- a top redistribution layer disposed on the at least one semiconductor die and electrically connected to the backside redistribution layer from the peripheral region; and
- a plurality of conductive terminals disposed on and electrically connected to the top redistribution layer.

9. The package structure according to claim 8, wherein the peripheral region comprises a plurality of second conductive patterns, and the plurality of second conductive patterns has uniform pattern density in the peripheral region.

10. The package structure according to claim 9, further comprising a plurality of semiconductor chips disposed on the backside redistribution layer and electrically connected to the plurality of second conductive patterns in the peripheral region, wherein the plurality of semiconductor chips and the at least one semiconductor die are located on two opposing surfaces of the backside redistribution layer.

11. The package structure according to claim 10, wherein the plurality of semiconductor chips is electrically connected to the plurality of second conductive patterns through a plurality of conducive bumps, and the plurality of conductive bumps is surrounded by an underfill structure.

12. The package structure according to claim 8, wherein the first pattern density D1 is 50% of the first zone, the second pattern density D2 is 60% of the second zone and the third pattern density D3 is 70% of the third zone.

13. The package structure according to claim 8, wherein the first pattern density D1 is 70% of the first zone, the second pattern density D2 is 60% of the second zone and the third pattern density D3 is 50% of the third zone.

14. The package structure according to claim 8, wherein the first zone has a circular shape from a top view of the package structure, the second zone is encircling the first zone, and the third zone is encircling the second zone and the first zone.

* * * * *